(12) United States Patent
Chen

(10) Patent No.: US 11,329,208 B1
(45) Date of Patent: May 10, 2022

(54) PIXEL ASSEMBLY PROCESS

(71) Applicant: J C Chen, Los Angeles, CA (US)

(72) Inventor: J C Chen, Los Angeles, CA (US)

( * ) Notice: Subject to any disclaimer, the term of this patent is extended or adjusted under 35 U.S.C. 154(b) by 0 days.

(21) Appl. No.: 17/108,551

(22) Filed: Dec. 1, 2020

(51) Int. Cl.
*H01L 33/62* (2010.01)
*H01L 33/08* (2010.01)
*H01L 33/00* (2010.01)
*H01L 27/15* (2006.01)

(52) U.S. Cl.
CPC ............ *H01L 33/62* (2013.01); *H01L 27/156* (2013.01); *H01L 33/0093* (2020.05); *H01L 2933/0066* (2013.01)

(58) Field of Classification Search
None
See application file for complete search history.

(56) References Cited

U.S. PATENT DOCUMENTS

| 8,409,886 | B2 * | 4/2013 | Iwafuchi | ................. H01L 24/82 257/89 |
|---|---|---|---|---|
| 8,552,928 | B2 | 10/2013 | Wendler | |
| 9,057,926 | B1 | 6/2015 | Brown | |
| 9,196,653 | B2 | 9/2015 | Leatherdale | |
| 9,507,196 | B2 | 11/2016 | Kurasawa | |
| 10,325,541 | B2 | 6/2019 | Hochman | |
| 10,796,648 | B2 | 10/2020 | Sakariya | |
| 2020/0127045 | A1 * | 4/2020 | Oyer | ................... H01L 33/0095 |

FOREIGN PATENT DOCUMENTS

| CN | 101956936 A | * 1/2011 | ........... G02B 6/0068 |
|---|---|---|---|
| EP | 3425618 | 1/2019 | |

* cited by examiner

*Primary Examiner* — Robert K Carpenter
(74) *Attorney, Agent, or Firm* — Clement Cheng

(57) ABSTRACT

Instead of discrete LED chips, monolithic LED strips reduce manufacturing time and inaccuracy when building high-resolution displays with small LED pixels of less than 100 micrometers. Guide strips next to LED strips align the monolithic LED strips and increase light emission area. A monolithic LED strip formed on a substrate has a P contact and an N contact. A first transfer layer is on an upper surface of the monolithic LED strip. The first transfer layer separates the monolithic LED strip from the substrate. A second transfer layer applied to the lower surface of the monolithic LED strip separates the monolithic LED strip from the first transfer layer. A display backplane is prepared with positive electrodes, negative electrodes, positive contact pads, and negative contact pads.

14 Claims, 15 Drawing Sheets

PIXEL ASSEMBLY PROCESS

FIELD OF THE INVENTION

The present invention is in the field of LED pixel assembly process technology. The disclosure relates to using monolithic LED strips, instead of discrete LED chips, as pixels or backlight in the fabrication of display panels.

DISCUSSION OF RELATED ART

A variety of different LED assembly methods have been described in the prior art. Traditionally, humans manually placed discrete LED elements on pixel packages or on display backplanes directly. For example, in U.S. Pat. No. 8,552,928B2 entitled sealed pixel assemblies, kits and methods, by inventor Brett Wendler et al., published Oct. 8, 2013. Over time, a variety of different automated processes improved LED pixel assembly accuracy and efficiency. However the use of discrete LED pixels in those processes presents several disadvantages, such as: high-cost, time-consuming and low-yield.

SUMMARY OF THE INVENTION

Instead of discrete LED chips, monolithic LED strips reduce manufacturing time and inaccuracy when building high-resolution displays with small LED pixels of less than 100 micrometers. Guide strips next to LED strips align the LED strips and increase light emission area. The LED strip is a monolithic LED strip having multiple independently controllable LEDs. The LED strip is mounted on the display backplane in a parallel configuration to multiple adjacent LED strips create a full-color display, and multiple adjacent LED strips are aligned parallel to each other.

A method for assembling an LED wafer structure includes the step of forming a monolithic LED strip on a substrate. The LED strip has a P contact and an N contact mounted on the LED strip. The LED strip has a first length, a first width and a first height. The first length is greater than the first width which is greater than the first height. A first transfer layer is on an upper surface of the LED strip. The first transfer layer separates the LED strip from the substrate.

A second transfer layer applied to the lower surface of the LED strip separates the LED strip from the first transfer layer. A display backplane is prepared with positive electrodes, negative electrodes, positive contact pads, and negative contact pads. Positive connection wires connect the positive electrodes to the positive contact pads, and negative connection wires connect the negative electrodes to the negative contact pads. A pair of guide strips includes a first guide strip and a second guide strip which are mounted to the display backplane. The display backplane is flexible. The LED strip is mounted between the pair of the guide strips. The LED strip is detached from the second transfer layer.

The method for assembling an LED wafer structure of claim preferably further includes the step of mounting a third guide strip and a fourth guide strip to the display backplane so that a second LED strip can be installed between the third guide strip and the fourth guide strip. The first guide strip, the second guide strip, the third guide strip, and the fourth guide strip can be formed as a translucent material or a transparent material. The method may include the step of forming the N contacts along an LED strip first side, and forming the P contacts along an LED strip second side. The method may also include the step of aligning the P-contacts with the positive electrodes and aligning the N contacts with the negative electrodes by engaging the inside surfaces of the guide strips to an LED strip first side and an LED strip second side.

High-resolution displays comprising LED pixels are difficult to manufacture when very small pixels (less than 100 micrometers) are used. In this disclosure, instead of using discrete LED chips in the display, monolithic LED strips were disposed on the display to reduce manufacture time and inaccuracy. Guide strips adjutant to LED strips were employed to help the alignment of LED strips as well as increasing light emission area.

The manufacturing procedure includes the step of transferring monolithic LED strips to the display backplane which are not discrete LED chips. The monolithic LED strips are chosen from the group of single-color red LEDs, green LEDs, blue LEDs, UV LEDs or multiple-color LEDs. The assembly process includes the step of transferring monolithic LED strips to the display backplane in a parallel configuration to create a full-color display. Multiple parallel strips create an array.

Figure 1:
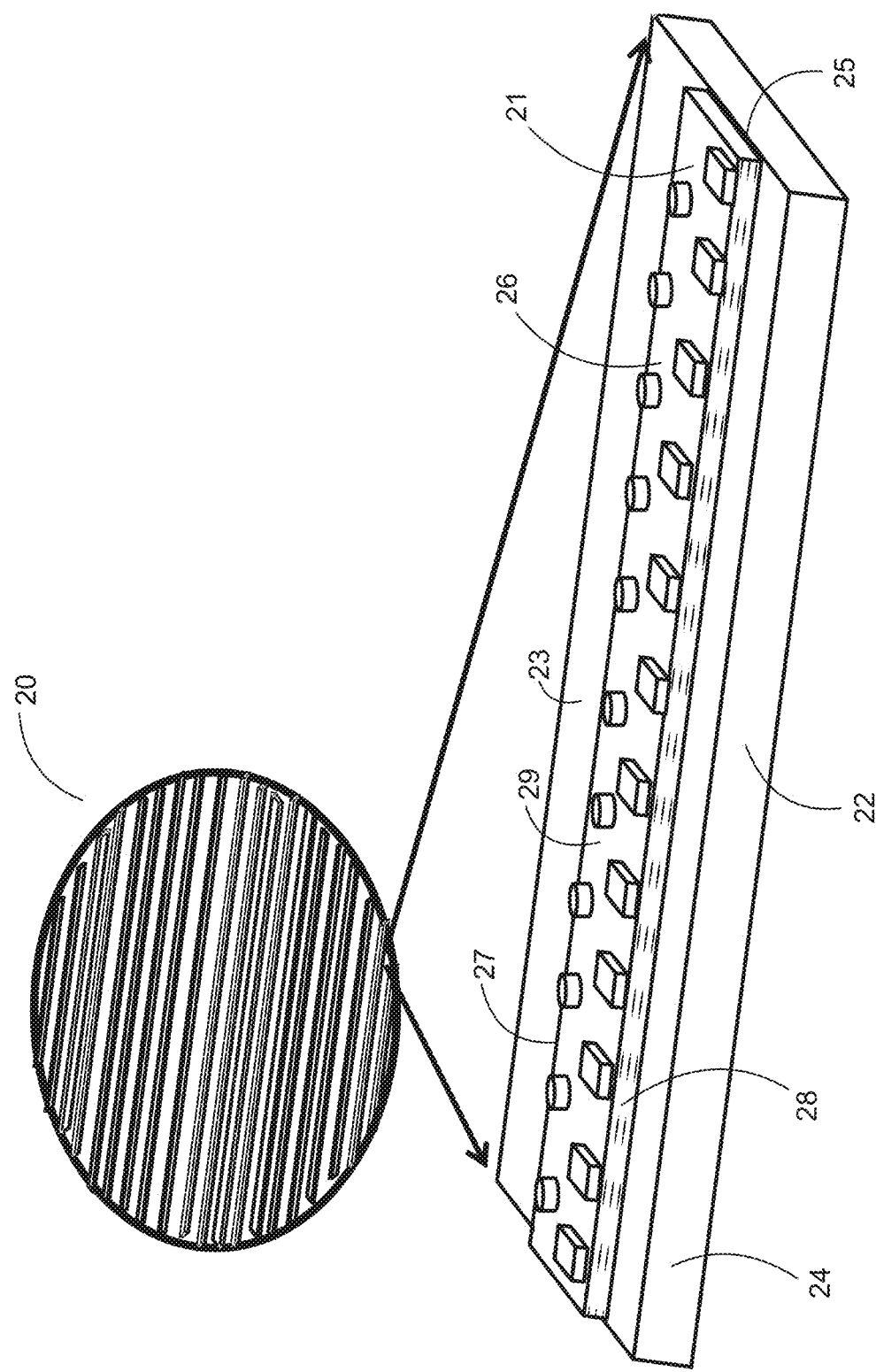
FIG. 1 is a diagram showing an LED wafer assembly which is a processed LED wafer with a portion of an LED strip.

The following call out list of elements can be a useful guide in referencing the elements of the drawings.
20 LED wafer
21 LED strip
22 LED substrate
23 Substrate upper surface
24 Substrate body
25 LED strip lower surface
26 LED upper surface
27 LED strip first side
28 LED strip second side 30 Contacts
31 P-contact
32 N-contact
33 LED section
34 LED section divider
35 LED section upper side
36 First LED section
37 Second LED section
38 Third LED section
40 First transfer layer
41 First transfer layer upper side
42 First transfer layer lower side
43 First transfer layer body
44 First separation gap
45 Second transfer layer
46 Second transfer layer upper surface
47 Second transfer layer bottom surface
48 Second separation gap
50 Electrodes
51 Positive electrodes
52 Negative electrodes
53 Positive electrodes strips
54 Negative electrode strips
55 Positive connection wires and contact pads
56 Negative connection wires and contact pads
57 Flexible sheet
58 Display backplane
59 Flexible sheet upper surface
60 Guide strips
61 First guide strip
62 Second guide strip
63 Third guide strip
64 Fourth guide strip
65 Fifth guide strip
66 Sixth guide strip
67 Third separation gap
81 First guiding strip side light
82 Second guiding strip light transmission
83 Third guiding strip side light transmission
84 Fourth guiding strip side light transmission
85 First guiding strip outward light
86 First LED strip outward light
87 Second guiding strip outward light
88 Third guiding strip outward light
89 Second LED strip outward light
90 Fourth guiding strip outward light
91 First LED strip
92 Second LED strip
L1 LED strip length
H1 LED strip height
W1 LED strip width
L2 transfer layer strip length
H2 transfer layer strip height
W2 transfer layer strip width
L3 guide strip length
H3 guide strip height
W3 guide strip width
W4 distance between two guide strips

DETAILED DESCRIPTION OF THE PREFERRED EMBODIMENT

As seen in FIG. 1, LED wafers 20 can be made of LED strips 21. Each LED strip 21 has an LED strip lower surface 25 and an LED strip upper surface 26. The LED strip 21 has an LED strip body 29 with an LED strip first side 27 and an LED strip second side 28. The LED strip 21 is formed on an LED substrate 22. The LED substrate 22 can be formed of sapphire, Si, SiC, GaN, and III-V materials. The LED strip lower surface 25 is formed on the LED substrate 22, on the substrate upper surface 23. The LED strips provide a higher LED density in a linear direction along the first length compared to an LED density in a direction perpendicular to the linear direction.

Figure 2:
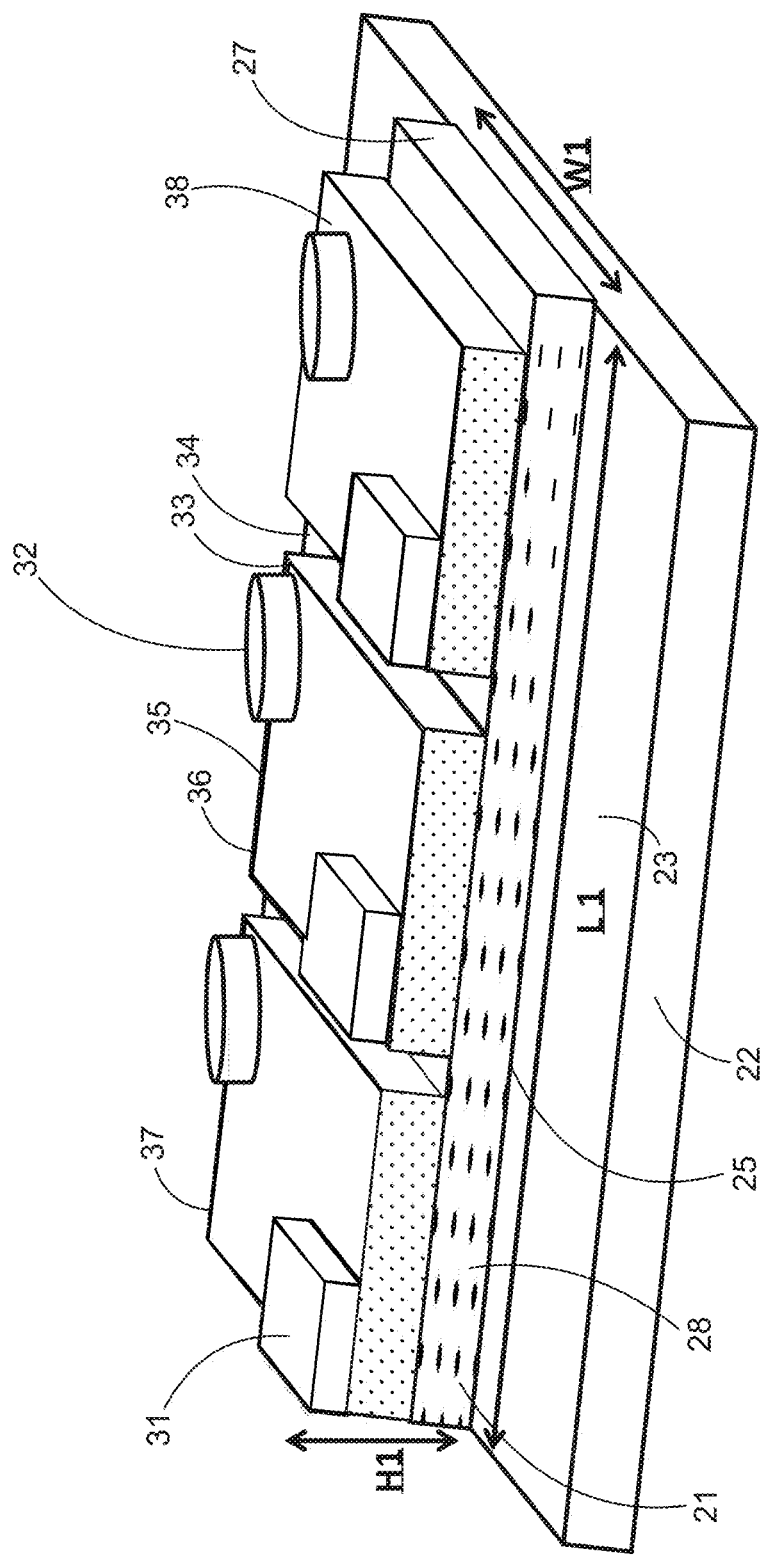
FIG. 2 is a detailed schematic diagram of a portion of the LED strip showing sections of LEDs.

As seen in FIG. 2, a portion of an LED strip 21 has contacts 30 including a P contact 31 and an N contact 32 mounted on the LED section upper side 35. The contacts 30 are formed on the LED section upper side 35. The LED sections 33 are divided from each other at LED section dividers 34. The first LED section 36 is bounded on a left side by a second LED section 37 and on the right side by a third LED section 38. An LED section divider 34 segments the first LED section 36 from the third LED section 38, and an LED section divider 34 segments the second LED section 37 from the first LED section 36.

The LED strip 21 has a first length L1 and a first width W1 and a first height H1. The substrate 22 has a substrate upper surface 23 that holds the LED strip 21 until it is lifted from the LED strip 21. The LED strip 21, particularly the LED strip lower surface 25 is formed on the LED substrate 22 on the substrate upper surface 23. The LED strip second side 28 and the LED strip first side 27 are elongated. The contacts 30 are formed along the sides with the P-contact 31 formed along the first side 28, and the N-contact 32 LED section 33 formed along the second side 27. The LED section divider 34 can be formed as a channel, or as an insulator. The LED section upper side 35 emits light. The first LED section 36, the second LED section 37, and the third LED section 38 emit light. The first length L1 is greater than the first width W1, which is greater than the first height H1.

Figure 3:
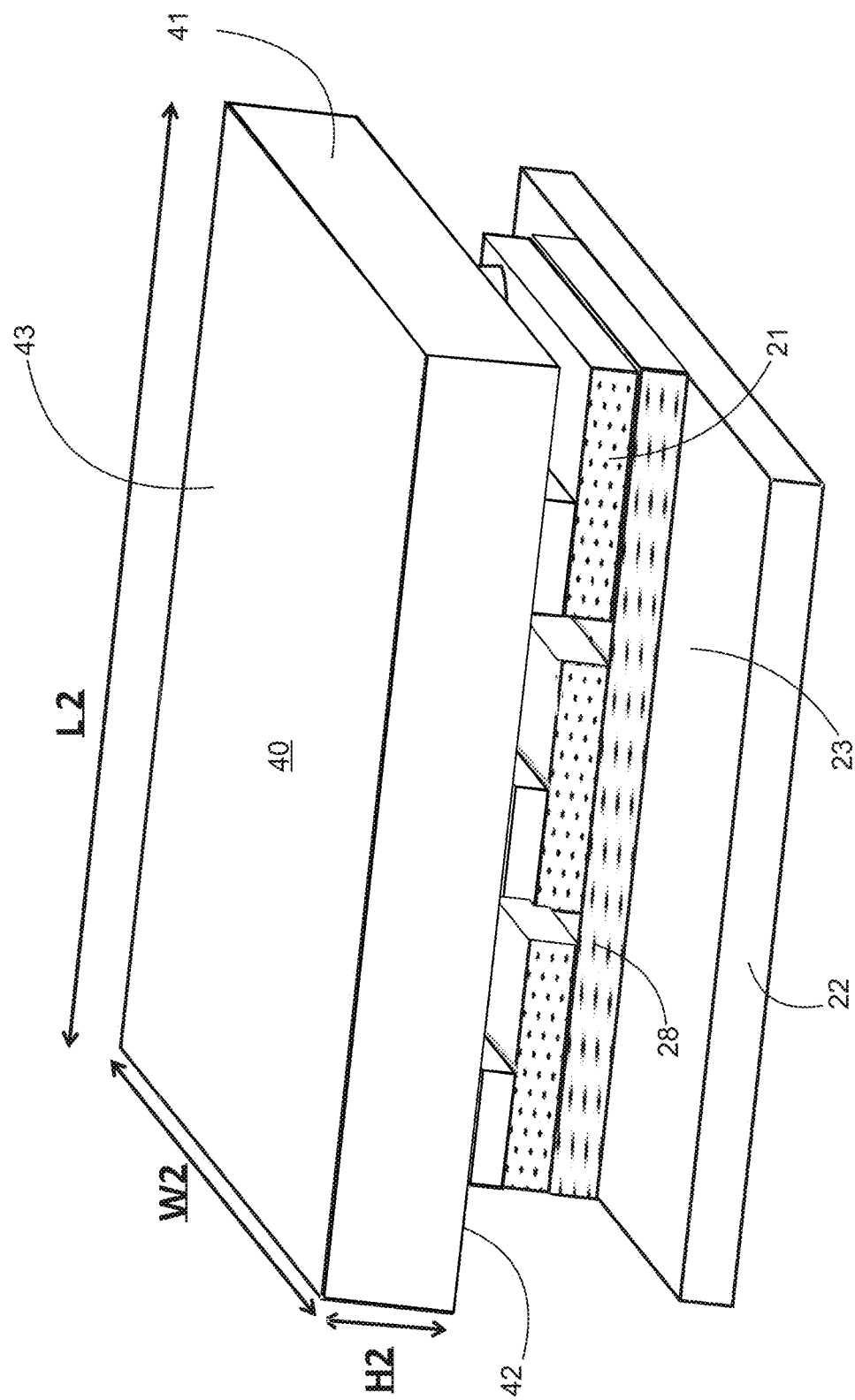
FIG. 3 is a schematic diagram of an LED strip covered with the first transfer layer.

As seen in FIG. 3, the first transfer layer 40 has a first transfer layer body 43 with a first transfer layer upper side 41 and a first transfer layer lower side 42. The first transfer layer lower side 42 adheres to the LED section upper side 35. The first transfer layer body 43 has a second width W2, a second length L2 and a second height H2. The first transfer layer 40 presses down on the LED strip 21 to grab the LED strip 21.

The LED strip 21 has an elongated LED substrate 22 with an elongated substrate upper surface 23. The LED strip second side 28 is also elongated. The first transfer layer 40 is also preferably elongated. The first transfer layer upper side 41 and the first transfer layer lower side 42. The second length L2 of the first transfer layer body 43 is greater than a second width W2 of the first transfer layer body, which is greater than the second height H2 of the first transfer layer body.

Figure 4:
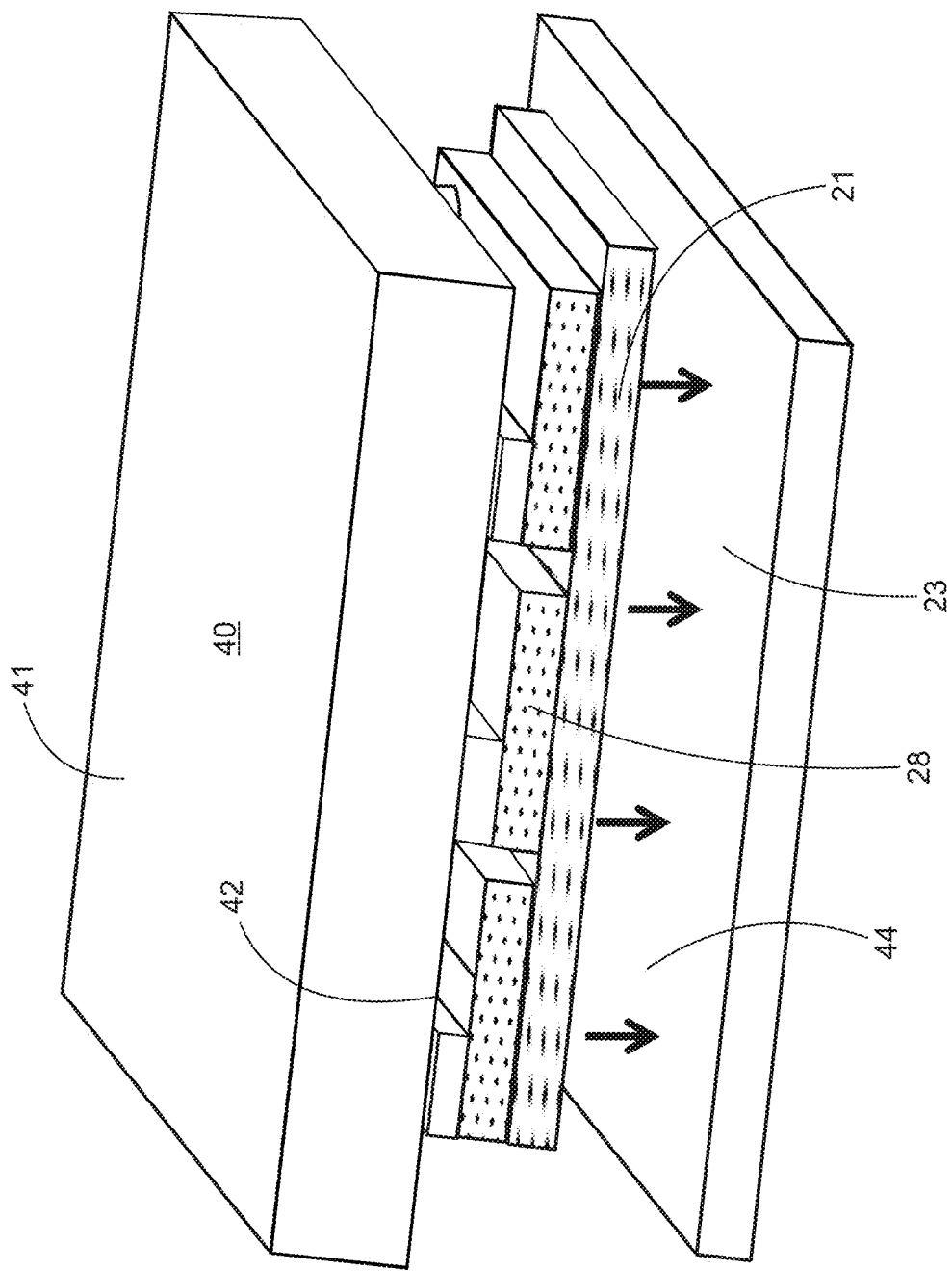
FIG. 4 is a diagram showing separation of the LED strips from the LED substrate after removal or thinning down.

As seen in FIG. 4, the first transfer layer upper side 41 opposes the first transfer layer lower side 42. The first transfer layer 40 can lift up and detach the LED strip 21 from the substrate upper surface 23 to create a first separation gap 44. The LED strip 21 is carried away from the LED substrate upper surface 23 and the LED substrate upper surface 23 can be reused for manufacturing additional LED strips 21.

The LED strip 21 releases from the LED substrate 22 and the substrate upper surface 23. The LED strip second side 28 also peels away from the substrate upper surface 23. The first transfer layer 40 with the first transfer layer upper side 41 and the first transfer layer lower side 42 is also elongated. The first separation gap 44 grows as the LED strip is pulled away from the LED substrate 22. The LED substrate could be formed for a continuous process, such as being mounted to or placed on a conveyor belt.

Figure 5:
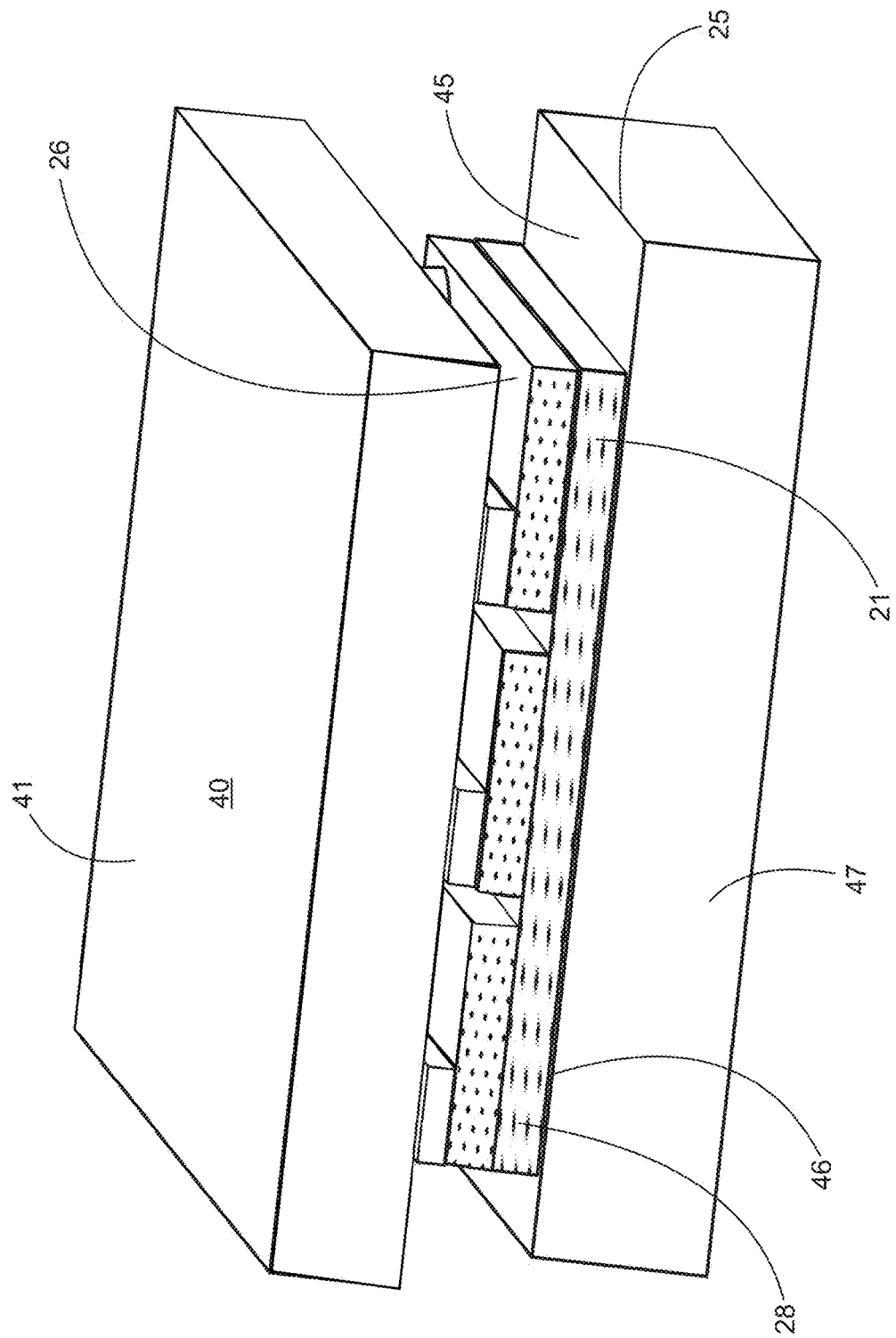
FIG. 5 is a diagram showing the LED strip covered with the second transfer layer on the bottom.
Figure 6:
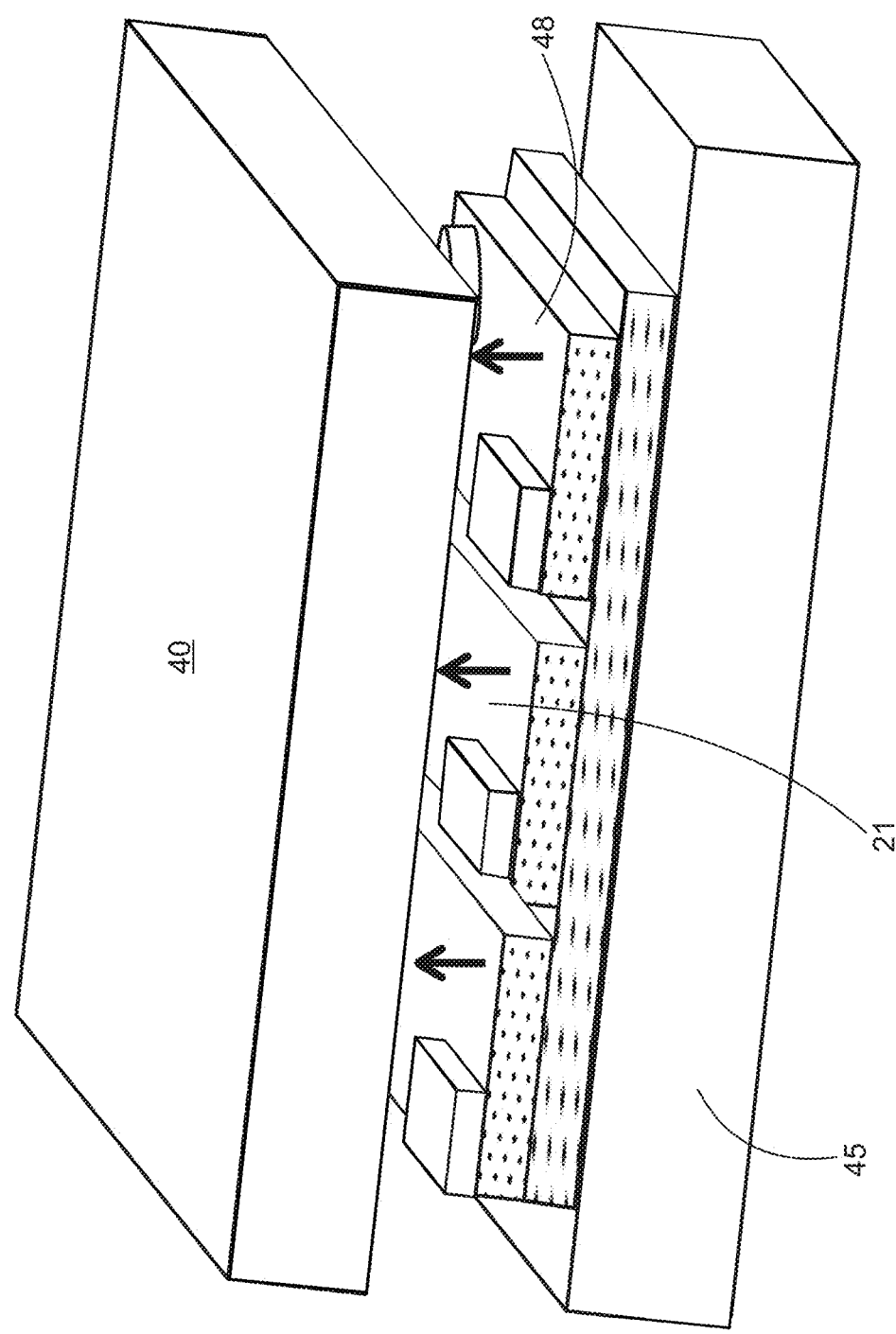
FIG. 6 is a diagram showing the first transfer layer removed from the LED strip.

As seen in FIG. 5, the first transfer layer 40 has a first transfer layer upper side 41 that can be connected to an external frame for lifting the first transfer layer 40. The LED strip upper surface 26 remains attached to the first transfer layer 40 until the second transfer layer 45 attaches to the LED strip 21 at the LED strip bottom surface 25. The second transfer layer upper surface 46 adheres to the LED strip lower surface 25 of the LED strip 21. The LED upper surface 26 detaches from the first transfer layer 40. LED strip second side 28 is not attached to the first transfer layer 40. The second transfer layer 45 may have an elongated second transfer layer upper surface 46 and may have an elongated second transfer layer bottom surface 47. The second transfer layer upper surface 46 adheres to the LED strip bottom surface 25. As seen in FIG. 6, the LED strip 21 has a second separation gap 48 when it peels away from the first transfer layer 40 after being more strongly adhered to the second transfer layer 45. The first transfer layer 40 and the second transfer layer are temporary attachments to the LED strip and can be configured in a continuous process such as being formed as a wheel, or by implementation on a conveyor belt.

Figure 7:
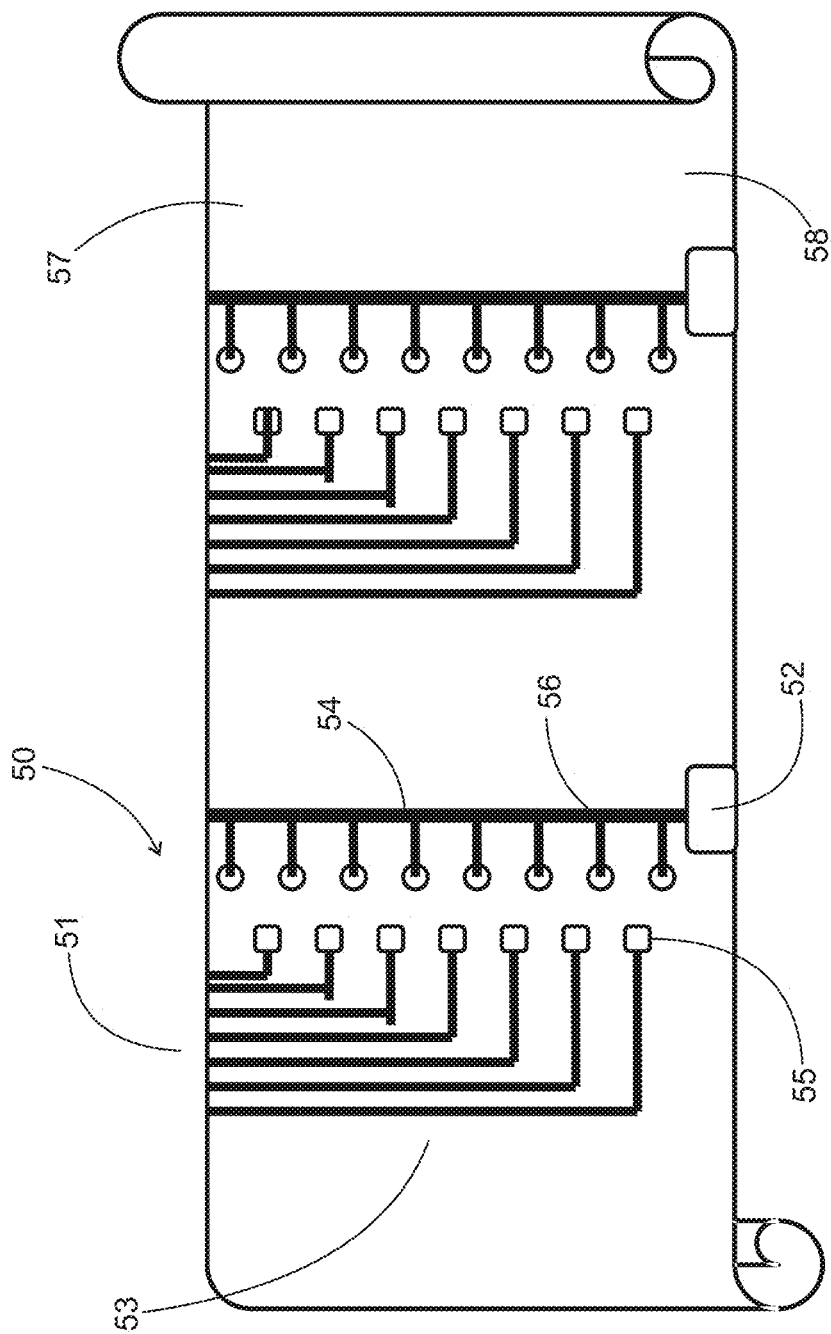
FIG. 7 is a diagram showing a display backplane with contact pads and connection wire is formed on a flexible sheet.

As seen in FIG. 7, the second transfer layer 45 then transfers the LED strip 21 to a flexible sheet 57. The flexible sheet 57 has electrodes 50 including positive electrodes 51 and negative electrodes 52 preformed on strips. Positive electrodes are formed on the ends of positive electrodes strips 53, and a negative electrode is mounted on the ends of negative electrode strips 54. The LED strips will be activated as positive pads 55 carry electric current to the negative pads 56 via the positive 31 and negative electrodes 32 of the LED strip 21. The flexible sheet 57 forms a display backplane 58 that can be mounted in an LED display.

Figure 8:
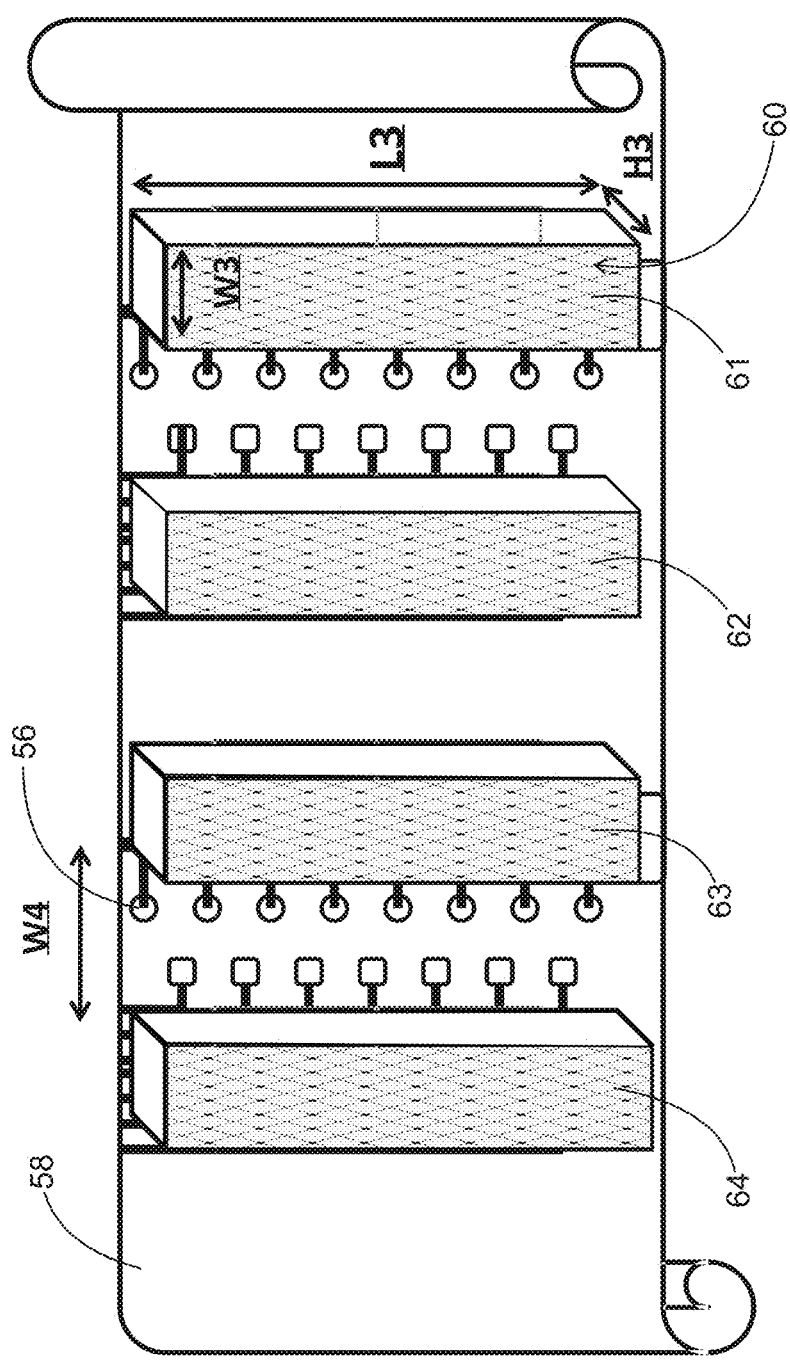
FIG. 8 is a diagram showing guide strips disposed to the display backplane.

As seen in FIG. 8, guide strips 60 may include a first guide strip 61, a second guide strip 62, a third guide strip 63, and a fourth guide strip 64. The contact pads 56 extend from underneath the guide strips 60. The contact pads 56 are mounted on the display backplane 58. Each of the guide strips 60 has a third length L3 that is greater than a third height H3 and a third width W3.

Figure 9:
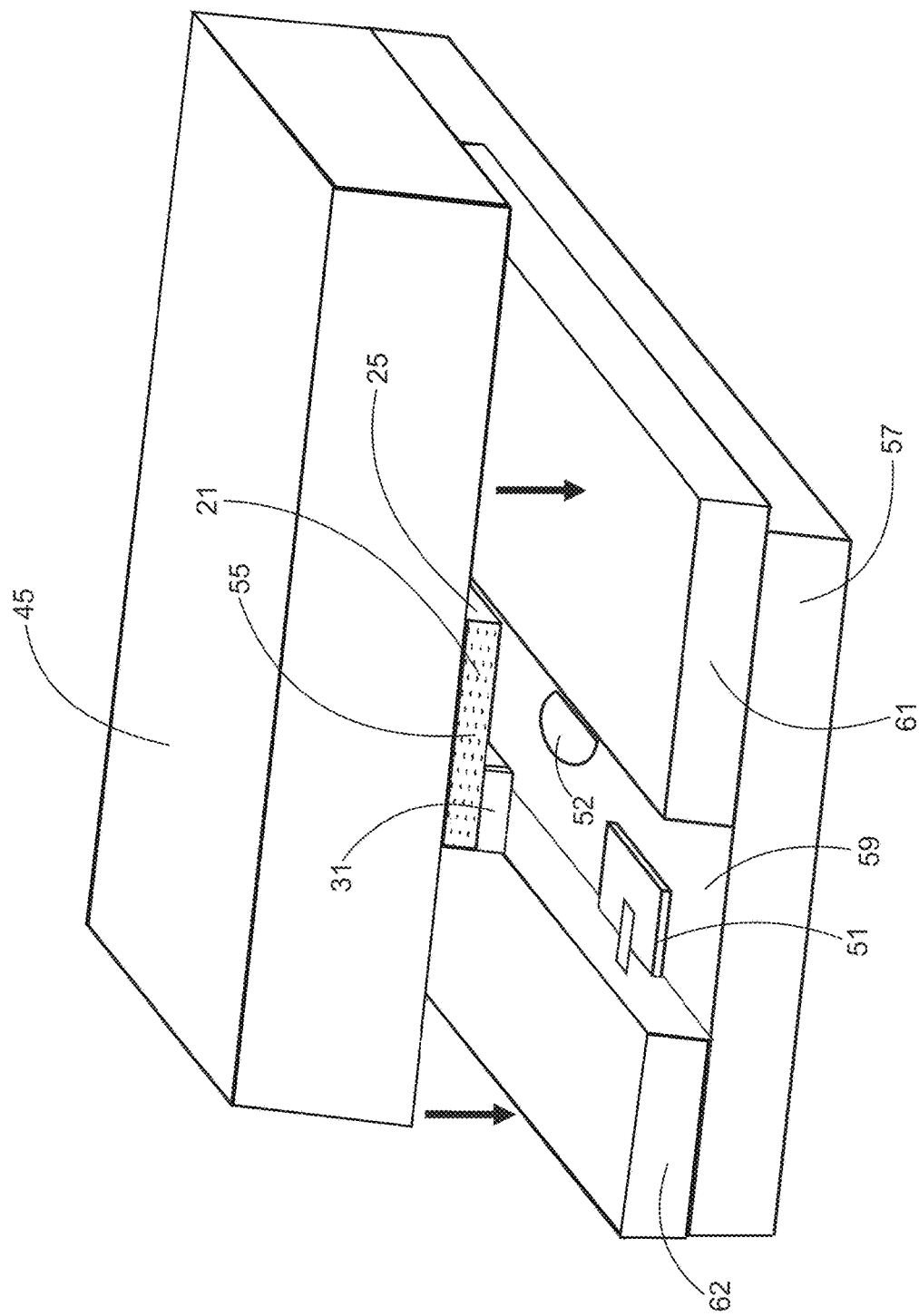
FIG. 9 is a diagram showing LED strips disposed to the display backplane by the flip chip method.

As seen in FIG. 9, LED strip 21 is inverted or flipped by the flip chip method. The LED upper surface 26 is now facing downwardly and is being aligned to the First guide strip 61 and the second guide strip 62. The P-contacts 31 align with the positive electrodes 55 and the N contacts 32 align with the negative electrodes 56 The second transfer layer 45 can be made of materials, such as plastic sheet, metal films, polymer films and the like, and may have elastomeric properties. The guide strips overlie the connection wires 55 formed on the flexible sheet upper surface 59 of the flexible sheet 57.

Figure 10:
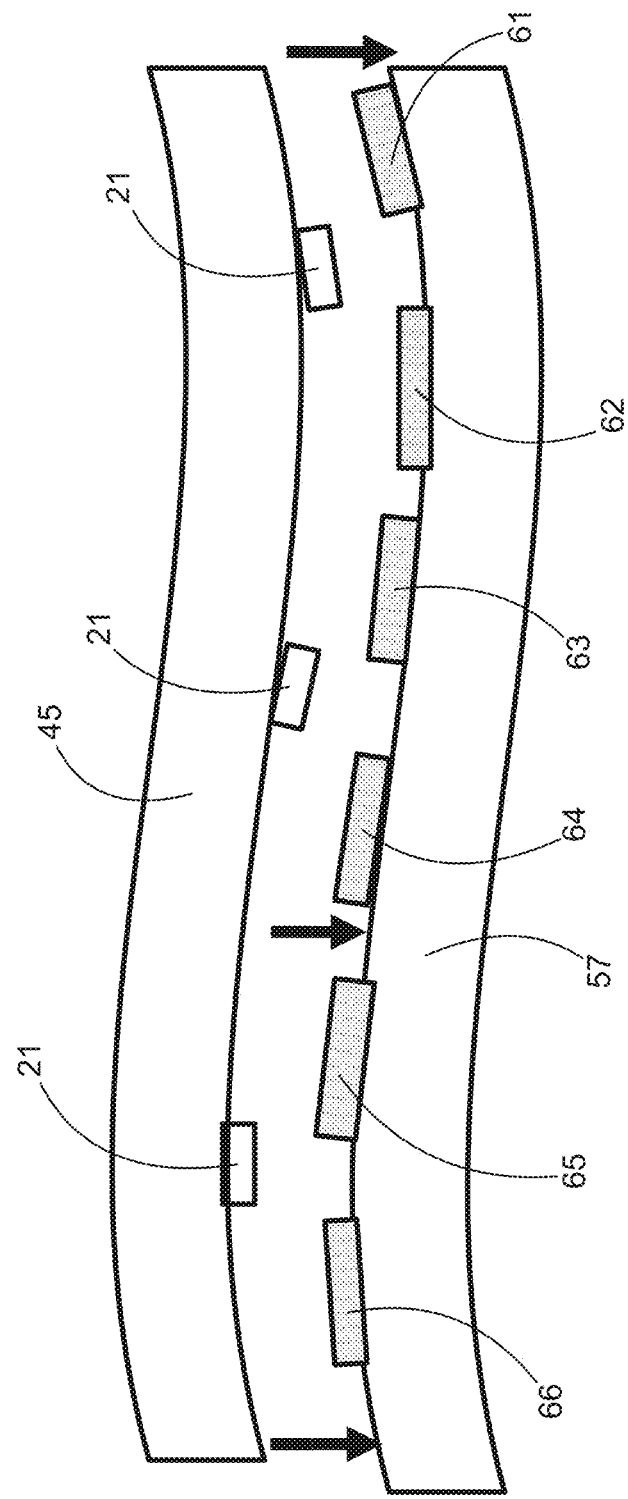
FIG. 10 is a side cross-sectional view of the LED strips disposed to the display panel.

As seen in FIG. 10, the second transfer layer 45 can be bent or twisted to release the LED strip 21 onto the flexible sheet 57 having the connection wires 55. A first LED strip can be lodged between the first guide strip 61 and the second guide strip 62. A second LED strip can be lodged between the third guide strip 63 and the fourth guide strip 64. A third LED strip can be lodged between the fifth guide strip 65 and the sixth guide strip 66 and the process can be repeated.

Figure 11:
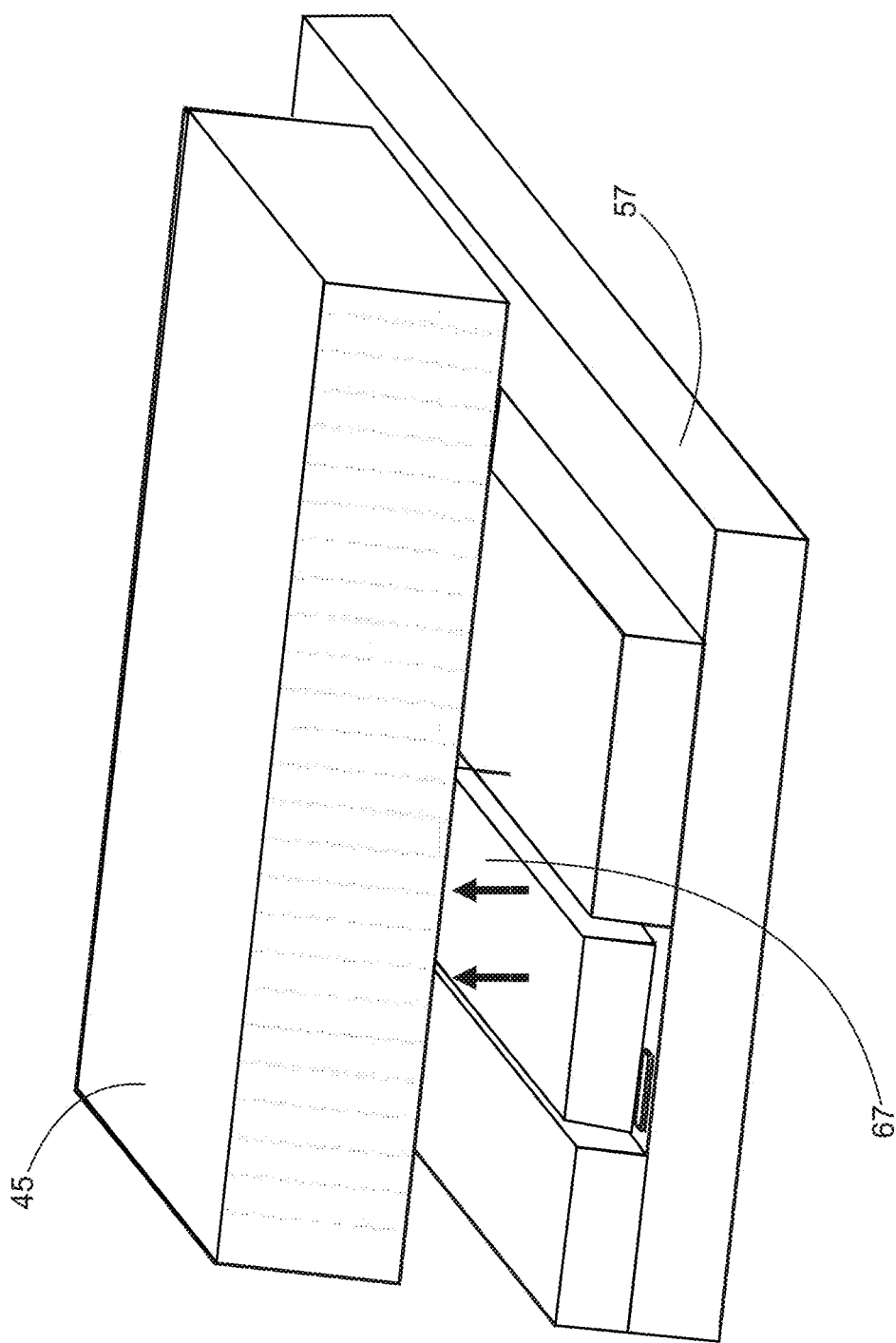
FIG. 11 is a cross-section diagram showing the second transfer layer removed to form the LED strip.

As seen in FIG. 11, the second transfer layer 45 can detach and formed a third separation gap 67 between the second transfer layer 45 and the flexible sheet 57. The second transfer layer 45 can be removed for further reuse. The second transfer layer 45 could be made as a wheel for example that is continuously rotating in a continuous process.

Figure 12:
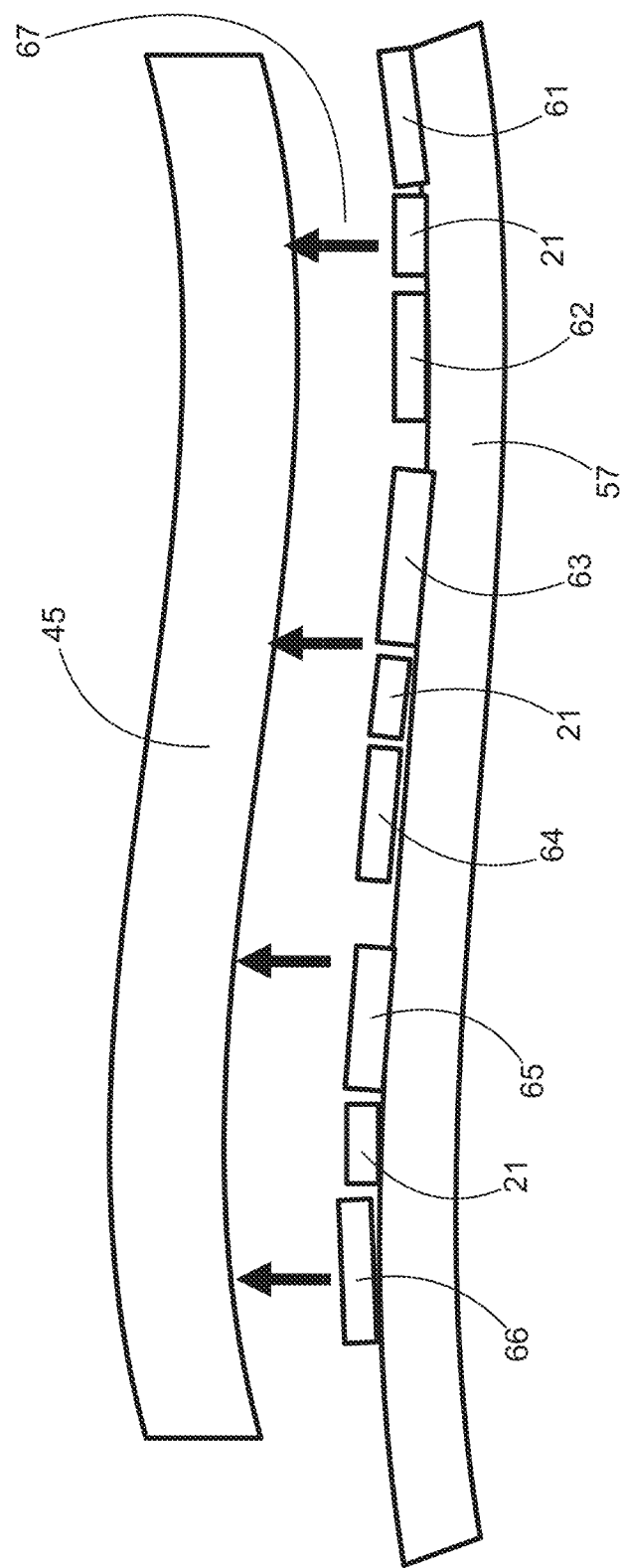
FIG. 12 is a side view cross-section of the second transfer layer removed to form the LED strip.

As seen in FIG. 12, the LED strip 21 is removed from the second transfer layer 45 and lodged to the flexible sheet 57. The flexible sheet 57 and the second transfer layer 45 can wrap or bend by being connected to a bending apparatus. When deformed, the LED strips transfer to the flexible sheet 57. The first guide strip 61, the second guide strip 62, the third guide strip 63, the fourth guide strip 64, the fifth guide strip 65, the sixth guide strip 66 are translucent or transparent so that light from the LED strip 21 can be transmitted to the guide strips and emitted outward accordingly. As a result, the light emission will be extended from the LED strip 21 to both guide strips.

Figure 13:
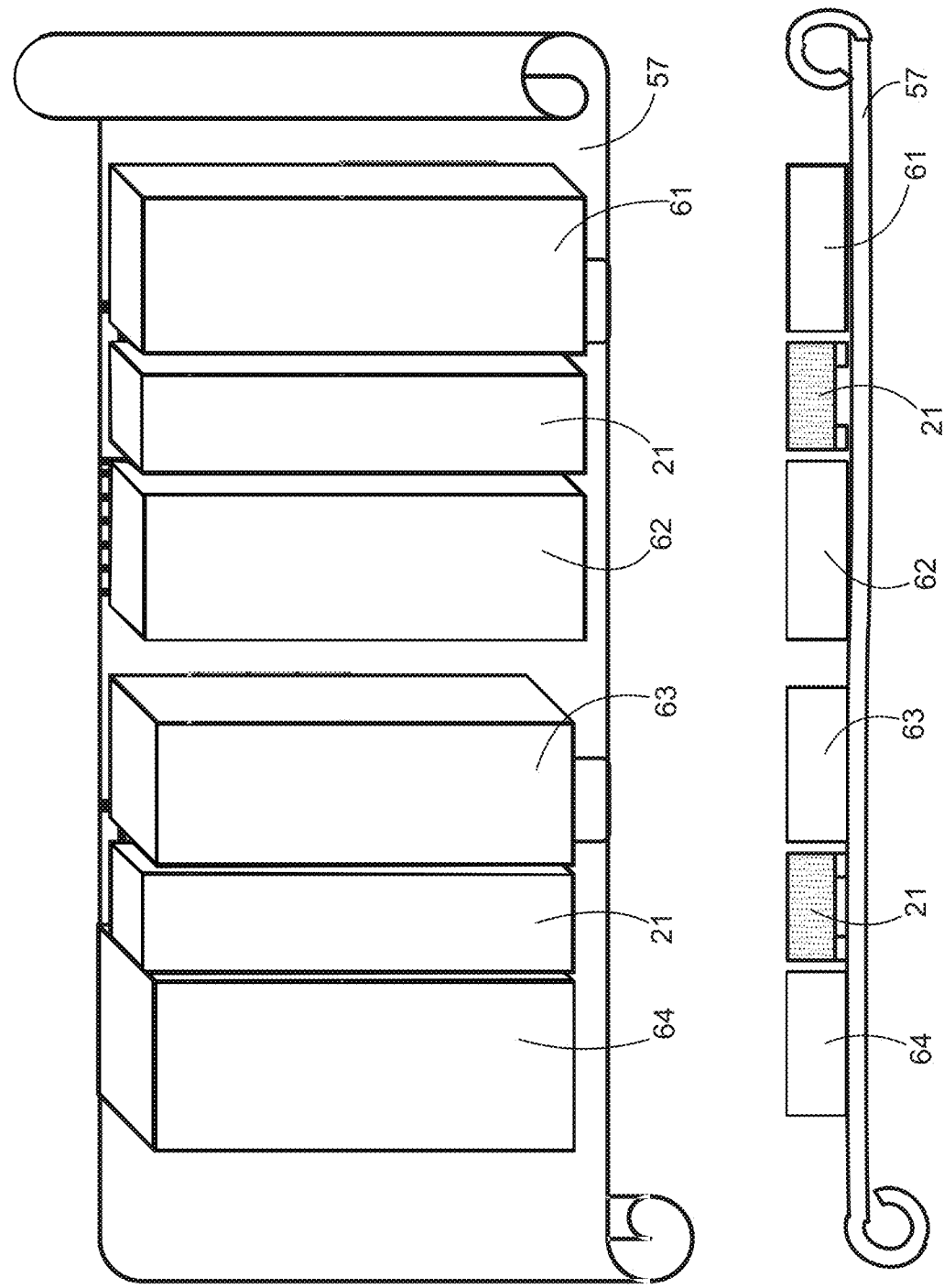
FIG. 13 is a completed display panel top view and side view.

As seen in FIG. 13, the LED strips 21, first guide strip 61, second guide strip 62, third guide strip 63, fourth guide strip 64 are all mounted to the flexible sheet 57.

Figure 14:
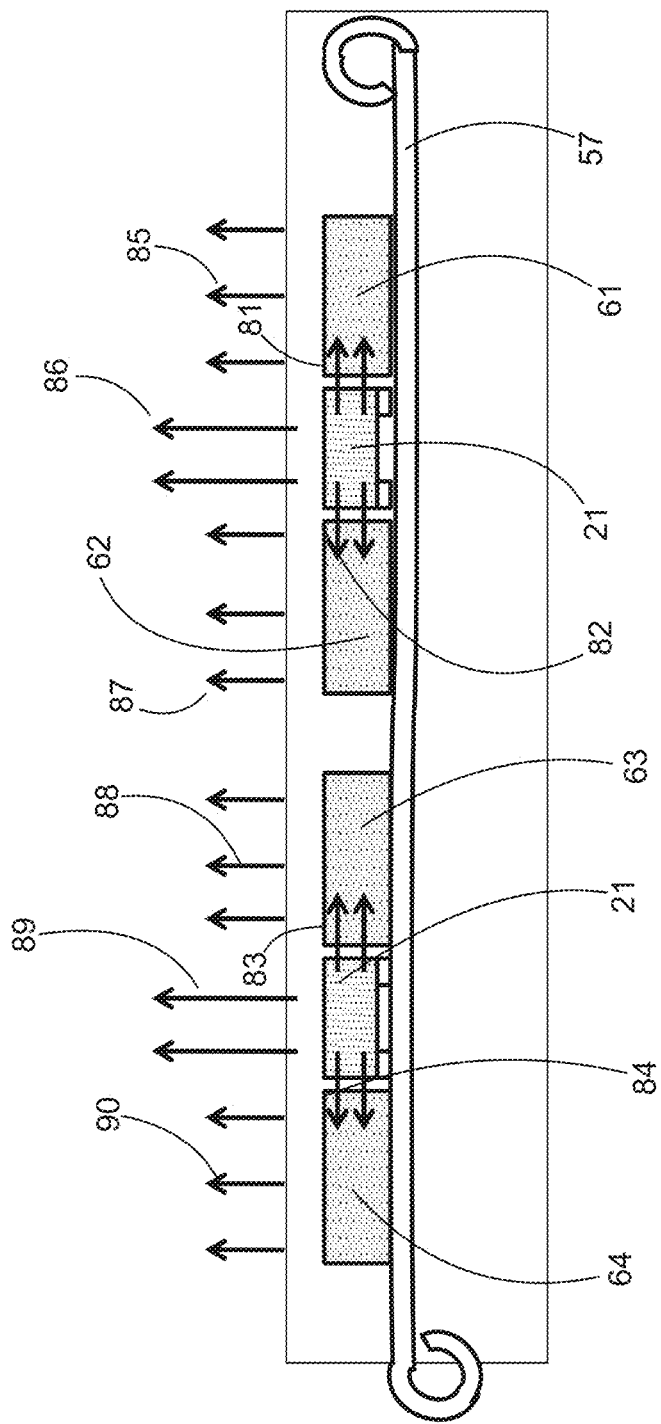
FIG. 14 is a cross section side view of the light emissions from the LED strips and guide strips.

As seen in FIG. 14, the first LED strip 21 produces light that transmits laterally and outwardly. On the flexible sheet 57, the first guide strip 61 receives a first guiding strip side light 81 into it. The first guide strip 61 then produces a first guiding strip outward light 85. The first LED strip 21 has a second guide strip 62 that receives a second guiding strip light transmission 82 which is then outwardly directed as the second guiding strip outward light 87.

Similarly, the second LED strip 21 is adjacent to a translucent or transparent third guide strip 63 and fourth guide strip 64 such that light transmission 80 produce light emissions. The second LED strip 21 provides a third guiding strip side light transmission 83 which provides a third guiding strip outward light 88. The second LED strip 21 provides a fourth guiding strip side light transmission 84 which is then reflected or otherwise transmitted as a fourth guiding strip outward light 90. The first and second LED strips 21 also have a first LED strip outward light 86 and the second LED strip outward light 89.

Figure 15:
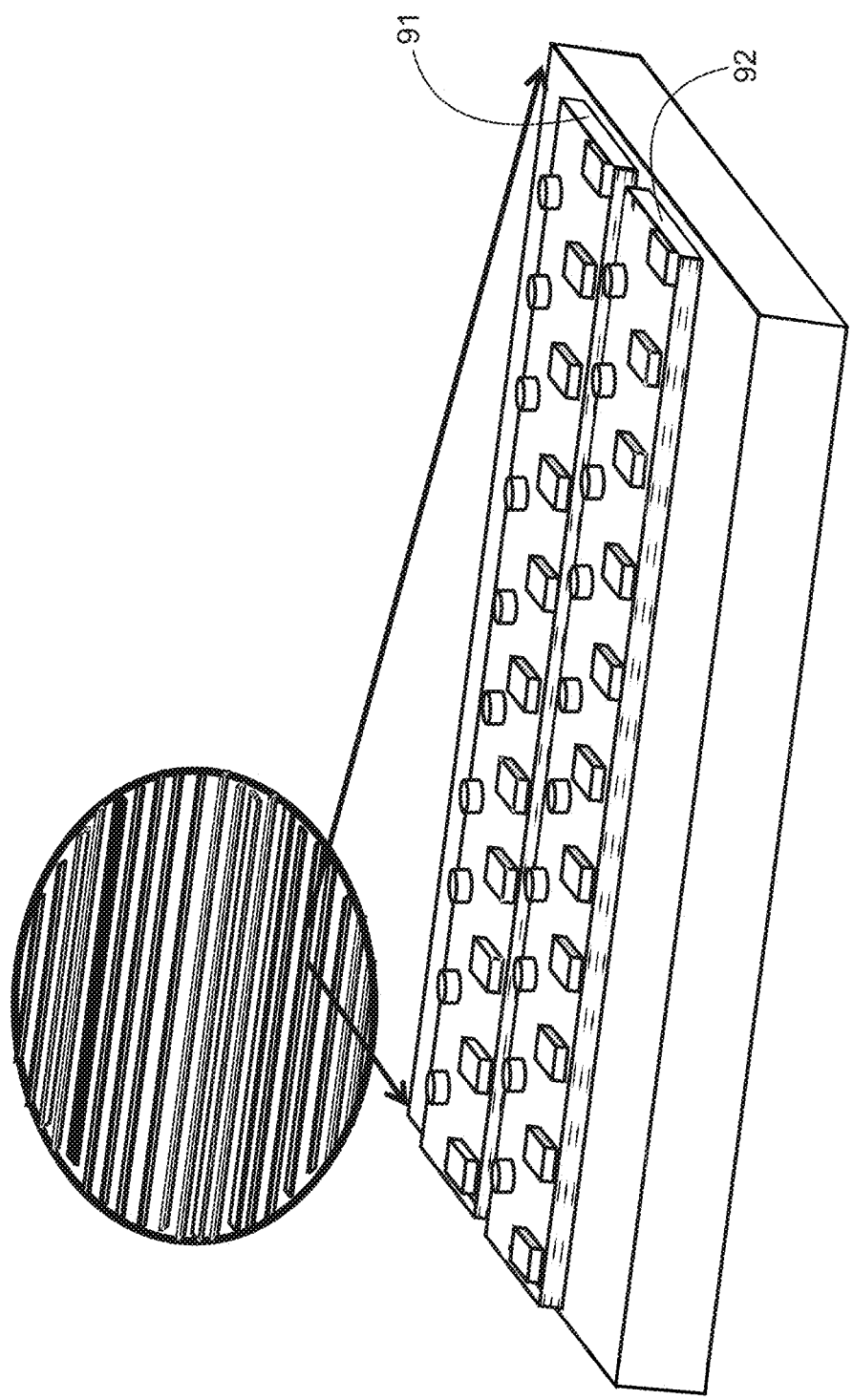
FIG. 15 is a diagram of a processed LED wafer showing a pair of LED strips mounted as a single unit to show that an LED strip can also be a guide strip.

As seen in FIG. 15, the LED strip can consist of two identical LED strips 91 and 92 which are adjacent to each other. This arrangement is to enhance the resolution of display as well as increase the footprint of LED strips to make strip-handling easier. The upper surface of the LED strip 91 is inverted and mounted upside down so that it is attached to the flexible sheet. The LED strip 91 illuminates from its bottom surface away from the flexible sheet. The bottom surface of the LED strip 91 was originally formed on the substrate. Thus, the flip chip method inverts the LED strip structure. The separate pixels of the LED strip can be segmented by gaps or separators, but are preferably connected to each other in a continuous manufacturing process.

A variety of single-color, such as red, green, blue and UV, LEDs or multiple-color LEDs, such as dual-color or full-color LEDs, can be formed as a strip. The present invention can be used in conjunction with multiple color LED technology. For examples, the combination of different color LED strips in one full-color display is attainable.

The materials for the monolithic light emitting device (M-LED) strips can be serial assembly of LED chips consisting of GaN- or GaAs-based materials monolithically grown and processed on sapphire, Si, SiC or GaAs substrates. The first width (W1) of M-LED strips range from 1 to 99,999 micro-meters and the first length (L1) ranges from 100 micro-meters to 999 centimeters. The first height (H1) ranges from 0.1 to 500 micro-meters.

Transfer layers include the first and second, also called top and bottom layers. These can be made of materials such as elastomeric polymers, glass, metal and plastic film. The second width (W2) ranges from 100 to 999,999 micro-meters and the second length (L2) ranges from 10,000 micro-meters to 9,999 centimeters. The second height (H2)

ranges from 1 to 50,000 micro-meters. Finally the distance between two guide strips W4 should be slightly larger than the width of LED strips and in the range of 1.05 to 99,999 micro-meters.

The guide strips can be made of materials such as silicon dioxide SiO2 deposited strips formed in the shape of stripes. The guide strips can also be made of elastomer such as elastomeric polymers, glass, plastic film, and the like. The third width (W3) of the guiding strip ranges from 0.5 to 99,999 micro-meters. The third length (L3) ranges from 100 micro-meters to 999 centimeters. The third height (H3) ranges from 0.1 to 500 micro-meters.

The display backplane can be made of materials such as plastic substrate, glass film or plate, thin metal foil, polymer material and the like. The key features of the present invention are:

1. A monolithic light emitting device (M-LED) strip has series of LED chips processed from the same semiconductor materials in a regular pattern and preferably with a uniform construction.
2. The M-LED strip can be used as a series of pixels compared with the common practice of using individual LEDs as single pixels.
3. The LED chips can be single-color, such as red, yellow, green, blue, UV or the like, as well as two-color or multi-color LEDs.
4. One M-LED stripe can also contain two or more serials of LED chips which were adjacent to each other as seen in FIG. 15.
5. Although, the same materials are used within the same M-LED strip, different M-LED strips can be fabricated from different materials. The combination of different types of M-LED strips in the same display panel is attainable.
6. The first width (W1) of M-LED strip ranges from 1 to 99,999 micro-meters, the first length (L1) ranges from 100 micro-meters to 999 centimeters and the height (H1) ranges from 0.1 to 500 micro-meters.
7. Two transfer layers (top and bottom) were used to carry the tiny M-LED stripes during the process. Therefore they should be large enough to cover the whole M-LED stripes and to be handled easily.
8. The second width (W2) of transfer layer ranges from 100 to 999,999 micro-meters, the second length (L2) ranges from 10,000 micro-meters to 9,999 centimeters and the second height (H2) ranges from 1 to 50,000 micro-meters.
9. A flexible sheet made of materials such as plastic substrate, glass film or plate, thin metal foil, polymer materials, with pre-deposited contacts (both p- and n-type) and connection wires can be used as the backplane of a display as seen in FIG. 7.
10. Guide strips can be disposed on the display backplane which was previously deposited with metal contact pads and connections, as shown in FIG. 7.
11. The distance (W) between two neighboring guide strips will be slightly larger than the first width (W1) of M-LED stripe, such as in the range of 1.2 to 100,000 micro-meters as seen in FIG. 8.
12. The guide strips can be made of materials such as: SiO2 deposited strips, elastomer, glass, plastic, polymer materials, and the like can serve as guiding rails for an easy alignment of M-LED stripes during the process.
13. The guide stripes can also serve as light waveguides to expand light emissions from M-LED stripes as seen in FIG. 14.
14. Although more-than-enough pixels were disposed in one row, some of them may not be required to be lit up during operations. However they can be used to provide redundant pixels to replace failed pixels if needed. This is because the LED density in a linear direction along the strip is greater than the LED density laterally of an LED strip.

The invention claimed is:

1. A method for assembling an LED wafer structure comprising the steps of:
   a. forming an LED strip on a substrate, wherein the LED strip has a P contact and an N contact mounted on the LED strip, wherein the LED strip has a first length, a first width and a first height, wherein the first length is greater than the first width which is greater than the first height;
   b. applying a first transfer layer on an upper surface of the LED strip;
   c. separating the LED strip from the substrate;
   d. applying a second transfer layer to the lower surface of the LED strip;
   e. separating the LED strip from the first transfer layer;
   f. preparing a display backplane having positive electrodes, negative electrodes, positive contact pads, negative contact pads, positive connection wires connecting the positive electrodes to the positive contact pads, and negative connection wires connecting the negative electrodes to the negative contact pads;
   g. mounting a pair of guide strips, namely first guide strip and a second guide strip to the display backplane, wherein the display backplane is flexible;
   h. mounting the LED strip between the pair of the guide strips; and
   i. detaching the LED strip from the second transfer layer.

2. The method for assembling an LED wafer structure of claim 1, further comprising the step of: mounting a third guide strip and a fourth guide strip to the display backplane.

3. The method for assembling an LED wafer structure of claim 2, further comprising the step of: installing a second LED strip between the third guide strip and the fourth guide strip.

4. The method for assembling an LED wafer structure of claim 3, further comprising the step of: providing a translucent material for the first guide strip, the second guide strip, the third guide strip, and the fourth guide strip.

5. The method for assembling an LED wafer structure of claim 4, further comprising the step of: providing a transparent material for the first guide strip, the second guide strip, the third guide strip, and the fourth guide strip.

6. The method for assembling an LED wafer structure of claim 1, further comprising the step of: forming the N contacts along an LED strip first side, and forming the P contacts along an LED strip second side.

7. The method for assembling an LED wafer structure of claim 2, further comprising the step of: aligning the P-contacts with positive electrodes and aligning the N contacts with negative electrodes by engaging the inside surfaces of the guide strips to an LED strip first side and an LED strip second side.

8. The method for assembling an LED wafer structure of claim 7, further comprising the step of: mounting a third guide strip and a fourth guide strip to the display backplane.

9. The method for assembling an LED wafer structure of claim 8, further comprising the step of: installing a second LED strip between the third guide strip and the fourth guide strip.

10. The method for assembling an LED wafer structure of claim 9, further comprising the step of: providing a translucent material for the first guide strip, the second guide strip, the third guide strip, and the fourth guide strip.

11. The method for assembling an LED wafer structure of claim 10, further comprising the step of: providing a transparent material for the first guide strip, the second guide strip, the third guide strip, and the fourth guide strip.

12. The method for assembling an LED wafer structure of claim 1, further comprising the step of: transferring monolithic LED strips to the display backplane which are not discrete LED chips.

13. The method for assembling an LED wafer structure of claim 12, wherein the monolithic LED strips are chosen from the group of single-color red LEDs, green LEDs, blue LEDs, UV LEDs or multiple-color LEDs.

14. The method for assembling an LED wafer structure of claim 13, further comprising the step of: transferring monolithic LED strips to the display backplane in a parallel configuration to create a full-color display.

\* \* \* \* \*